United States Patent
Braat et al.

(10) Patent No.: US 6,373,552 B1
(45) Date of Patent: *Apr. 16, 2002

(54) OPTICAL CORRECTION PLATE, AND ITS APPLICATION IN A LITHOGRAPHIC PROJECTION APPARATUS

(75) Inventors: Josephus J. M. Braat, Delft; Cornelis J. van der Laan, Maasluis, both of (NL)

(73) Assignee: ASM Lithography B.V., Veldhoven (NL)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/484,200

(22) Filed: Jan. 18, 2000

(30) Foreign Application Priority Data

Jan. 20, 1999 (EP) .............................. 99200156

(51) Int. Cl.$^7$ ................. G03B 27/68; G03B 27/00; G03B 27/32; G03B 21/00; G01B 11/02
(52) U.S. Cl. ..................... 355/52; 355/18; 355/31; 355/47; 355/104; 355/50; 353/5; 353/69; 356/355
(58) Field of Search .................. 355/18, 31, 47, 355/104, 50, 52; 353/5, 69; 356/355

(56) References Cited

U.S. PATENT DOCUMENTS

| | | | | |
|---|---|---|---|---|
| 3,255,005 A | * | 6/1966 | Green | 96/36 |
| 3,573,456 A | * | 4/1971 | Beeh | 250/65 |
| 5,392,119 A | | 2/1995 | McArthur et al. | |
| 5,583,609 A | * | 12/1996 | Mizutani et al. | 355/46 |
| 5,640,233 A | * | 6/1997 | McArthur et al. | 356/124 |
| 5,871,266 A | * | 2/1999 | Negishi et al. | 353/98 |
| 5,929,991 A | * | 7/1999 | McArthur et al. | 356/355 |
| 5,994,006 A | * | 11/1999 | Nishi | 430/22 |
| 6,034,378 A | * | 3/2000 | Shiraishi | 250/559.29 |

FOREIGN PATENT DOCUMENTS

| | | |
|---|---|---|
| EP | 0 687 896 B1 | 12/1995 |
| EP | 0 724 199 A1 | 7/1996 |
| NL | 6612149 | 8/1966 |
| WO | 99/05709 | 2/1999 |

OTHER PUBLICATIONS

Japanese Patent Abstracts, re JP 58–95702, Jun. 1983.
Japanese Patent Abstracts, re JP 62–35619, Feb. 1987.
Japanese Patent Abstracts, re JP 63–158517, Jul. 1988.
Japanese Patnet Abstracts, re JP 63–232320, Sep. 1988.

\* cited by examiner

*Primary Examiner*—Russell Adams
*Assistant Examiner*—Khaled Brown
(74) *Attorney, Agent, or Firm*—Pillsbury Winthrop LLP

(57) ABSTRACT

A plate with substantially constant thickness is used to compensate for the residual distortion in the image projected by a high-quality projection lens for lithography. The two surfaces of the plate have an identical aspherical profile, whose shape has been calculated using the measured distortion map of the lithographic objective. The figuring process applied to the plate uses the principle of polishing in the presence of an elastic deformation, so as to achieve the desired aspherical shape on both sides.

11 Claims, 2 Drawing Sheets

OPTICAL CORRECTION PLATE, AND ITS APPLICATION IN A LITHOGRAPHIC PROJECTION APPARATUS

BACKGROUND OF THE INVENTION

The invention relates to an optical correction plate. More specifically, the invention relates to the use of such a plate in a lithographic projection apparatus comprising.

Lithographic projection apparatus can be used, for example, in the manufacture of integrated circuits (ICs). In such a case, the mask (reticle) may contain a circuit pattern corresponding to an individual layer of the IC, and this pattern can then be imaged onto a target area (die) on a substrate (silicon wafer) which has been coated with a layer of photosensitive material (resist). In general, a single wafer will contain a whole network of adjacent dies that are successively irradiated through the reticle, one at a time. In one type of lithographic projection apparatus, each die is irradiated by exposing the entire reticle pattern onto the die in one go; such an apparatus is commonly referred to as a waferstepper. In an alternative apparatus—which is commonly referred to as a step-and-scan apparatus—each die is irradiated by progressively scanning the reticle pattern through the projection beam in a given reference direction (the "scanning" direction) while synchronously scanning the wafer table parallel or anti-parallel to this direction; since, in general, the projection system will have a magnification factor M (generally<1), the speed v at which the wafer table is scanned will be a factor M times that at which the reticle table is scanned. In both types of apparatus, after each die has been imaged onto the wafer, the wafer table can be "stepped" to a new position so as to allow imaging of a subsequent die. More information with regard to lithographic devices as here described can be gleaned from International Patent Application WO 97/33205.

Up to very recently, apparatus of this type contained a single mask table and a single substrate table. However, machines are now becoming available in which there are at least two independently movable substrate tables; see, for example, the multi-stage apparatus described in International Patent Applications WO 98/28665 and WO 98/40791. The basic operating principle behind such multi-stage apparatus is that, while a first substrate table is underneath the projection system so as to allow exposure of a first substrate located on that table, a second substrate table can run to a loading position, discharge an exposed substrate, pick up a new substrate, perform some initial alignment measurements on the new substrate, and then stand by to transfer this new substrate to the exposure position underneath the projection system as soon as exposure of the first substrate is completed, whence the cycle repeats itself; in this manner, it is possible to achieve a substantially increased machine throughput, which in turn improves the cost of ownership of the machine.

The projection radiation in current lithographic devices is generally UV (ultra-violet) light with a wavelength of 365 nm, 248 nm or 193 nm. However, the continual shrinkage of design rules in the semiconductor industry is leading to an increasing demand for new radiation types. Current candidates for the near future include UV light with wavelengths of 157 nm or 126 nm, as well as extreme UV light (EUV) and particle beams (e.g. electron or ion beams).

In projection lithography, a very high-quality projection system is used to project a reduced image of the mask pattern onto the silicon wafer. As compared to other types of projection systems, lithographic projection systems have to satisfy very stringent requirements with respect to inter alia aberration correction, flatness of field and absence of distortion. This latter aberration is harmful regarding the aspect of "overlay precision": different patterns, projected onto the wafer in subsequent process steps, should superimpose upon one another with an accuracy of the order of about 30 nm (conventional figure) over the full image field, which has typical dimensions of the order of about 25×25 mm$^2$. For this reason, the residual distortion of a high-quality lithographic objective should be extremely low. While the as-designed value of the residual distortion can be very low (only a few nm), the value of a manufactured objective may show larger values. Possible reasons for this residual distortion are small mounting errors of the (typically) large number of optical elements in a given projection system, but also small index variations in refractive material and/or reflective coatings used in such elements. In some cases, a highly expensive objective that satisfies all other specifications (e.g. aberration correction level, field flatness) may have to be rejected because of its residual distortion.

SUMMARY OF THE INVENTION

It is an object of the invention to address this problem. In particular, it is an object of the invention to provide a mechanism for reducing the residual distortion of a projection system to below a specified level, so as to avoid having to quality-reject such a system. Moreover, it is an object of the invention to provide a mechanism of correcting a potential drift in distortion during the installed "lifetime" of a projection system in a lithographic projection apparatus.

These and other objects are achieved in a lithographic projection apparatus in which a correction mechanism is provided at a point outside the projection system but along its optical axis, the correction mechanism comprising a plate of material which is substantially transparent to the radiation supplied by the radiation system, the plate having a substantially uniform thickness and an aspherical surface profile, which surface profile is calculated so as to have a counteractive effect on a measured optical distortion of the projection system.

It should be explicitly noted that the term "projection system" as employed in this text encompasses not only lenses made of refractive material, but also projection mirror systems and catadioptric systems, for example.

According to the invention, an aspherically deformed plate with substantially constant thickness is positioned at some point along the radiation path through the lithographic projection apparatus, e.g. between the mask table and the projection system. By means of the locally varying inclination of the aspherical plate, the apparent position of an object point on the mask suffers a lateral shift. The lateral shift $\delta_x$ on the mask from A to A' (in the X-direction: see FIG. 2) is given by $$\delta_x = \frac{(n-1)}{n} \partial_x \cdot t$$

with a comparable expression for the shift $\delta_y$ in the Y-direction.

Thanks to the constant thickness t of the correction plate, the field flatness of the projected image is not affected by the presence of the plate. Moreover, the plate's constant thickness t ensures that any absorption of the projection radiation which occurs in the plate will be substantially homogenous across the extent of the plate, thus preventing the occurrence of substantial dose and uniformity errors at substrate level as a result of the presence of the plate.

To compute the shape of the correction plate required in a given situation, distortion data are measured at a certain number of sample points (e.g. 100 points) in the image field of the projection system. This can, for example, be done by exposing a test substrate with an image of a test mask (e.g. a special distortion measurement mask), then selecting a certain number of sample (object) points on the mask and measuring the corresponding (image) points on the substrate. The theoretical position of the image points on the substrate in the absence of distortion can be calculated by correcting for the magnification of the projection system. By comparing the positions of the calculated image points and those of the actual measured image points on the substrate, one can calculate the distortion $(\delta_x, \delta_y)_k$ at a particular point. These data yield a set of values $(\delta_x, \delta_y)_k$ which are translated into local inclination angles $(\theta_x, \theta_y)_k$. The aspherical shape of the plate (with substantially constant thickness) is obtained by finding a least-squares solution of the resulting set of linear equations, with the required slopes as variables and with the continuity of the surface at all measured points as a physical boundary condition. In general, the inventors have observed a quick convergence towards a solution, and have found that a reduction of the distortion by a factor of the order of 3 is feasible.

The invention also relates to a method of manufacturing an optical correction plate (aspherical plate) as specified in Claim 1. Because the plate according to the invention needs to have a substantially constant thickness, it can be quite difficult to manufacture. In this context, the principle applied by the inventors is the polishing of a surface while it is subjected to an elastic deformation. The primary step is to suck a plane-parallel plate against a base surface with the desired aspherical profile, and then work the exposed surface flat. When the plate is released by removing the retaining vacuum, the worked upper surface will assume the (negative) shape of the base plate, while the lower surface will resume its initial flat shape.

In a practical manufacturing process, the principle set forth in the previous paragraph is slightly modified, as illustrated in FIG. 3. A substantially flat plate made of appropriate refractive material (e.g. quartz, $CaF_2$ or a glass with sufficient UV transmission) receives the calculated profile (typical height of several microns) on one side, by means of the deposition of a sequence of thin layers. Next, the plate is inverted and sucked to a vacuum table, and the upper surface is polished flat; the plate now has a substantially constant thickness. After releasing the plate, it is inverted, sucked to the vacuum table and worked flat again, thereby taking away the initially deposited aspherical profile. When the plate is finally released, it has a substantially constant thickness, and assumes the desired aspherical shape on both sides.

Several factors should be monitored during the calculation and manufacturing process described above:

The initial plane-parallel plate should be made in such a way that is has substantially no residual stresses. Initial stress in the plate can be released during the polishing process, and cause deformation of the required aspherical profile;

The thickness of the plate is typically chosen to be rather small, e.g. 3 to 5 mm. At these values, bending of the plate under its own weight is not negligible, and this can introduce an extra residual distortion of mainly third order, which should be compensated for in the calculated aspherical profile;

In a particular embodiment, the deposition process used to create the aspherical profile employs a certain number of deposition steps through geometric masks, causing a histogram-like profile to be built up. The number of steps and the total height determine the height steps present in the profile. The polishing process should average out these residual discrete steps in the aspherical profile.

In a final process step, the shape of the aspherical profile in the manufactured plate is measured. A particularly satisfactory measurement method is Phase Stepping Interferometry, with an accuracy of typically 50 nm across a total measuring range of 10 $\mu$m (as a maximum). Initial results have indicated that it is possible to achieve an accuracy of better than 1.0 $\mu$m in the aspherical profile of the plate. The possible influence of gravitation on the shape of the aspherical plate has already been mentioned; in this context, the position and orientation of the (rather thin) plate is of importance during the measurement procedure, and also in respect of the final positioning of the finished plate in the lithographic projection apparatus. The way in which the plate is mounted (in its holder) deserves specific attention. In this context, the inventors have designed a satisfactory plate holder whose rim shape is matched to the specific shape of the correction plate involved.

In theory, the correction plate according to the invention can be positioned at various different locations outside the projection system. However, in practice, many of these locations may be inappropriate due, for example, to a lack of space at the location concerned; e.g. there is generally very little room between the projection system and the substrate table. In this context, an advantageous embodiment of the apparatus according to the invention is characterized in that the correction plate is situated between the mask table and the projection system. However, if desired, the correction plate may also, for example, be located within the illuminator of the lithographic projection apparatus, i.e. between the radiation system and the mask table.

The optical correction plate according to the invention may comprise various materials, provided it remains substantially transparent to the radiation supplied by the radiation system (typically UV light). In principle, suitable materials include glass (including flint, crown and soda glass, for example), quartz, silica, and various fluorides, such as calcium fluoride. The material chosen should also be compatible with the process (grinding, polishing, etc.) by which the correction plate is given its aspherical profile.

The inventors have observed that a relatively thin correction plate gives highly satisfactory results. In practice, an appropriate thickness will be dictated on the one hand by the process used to manufacture the plate (issues such as flexibility and fragility) and on the other hand by optical demands on the plate (minimal absorption). In general, a thickness in the range 1–6 mm was found to be suitable, with thicknesses of the order of about 3–5 mm yielding particularly good performance.

In a manufacturing process using a lithographic projection apparatus according to the invention, a pattern in a mask is imaged onto a substrate which is at least partially covered by a layer of energy-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are required, then the whole procedure, or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target area", respectively.

DESCRIPTION OF THE DRAWINGS

The invention and its attendant advantages will be further elucidated with the aid of exemplary Embodiments and the accompanying schematic drawings, wherein.

In the Figures, corresponding parts are denoted by corresponding reference symbols.

DETAILED DESCRIPTION

Embodiment 1

Figure 1:
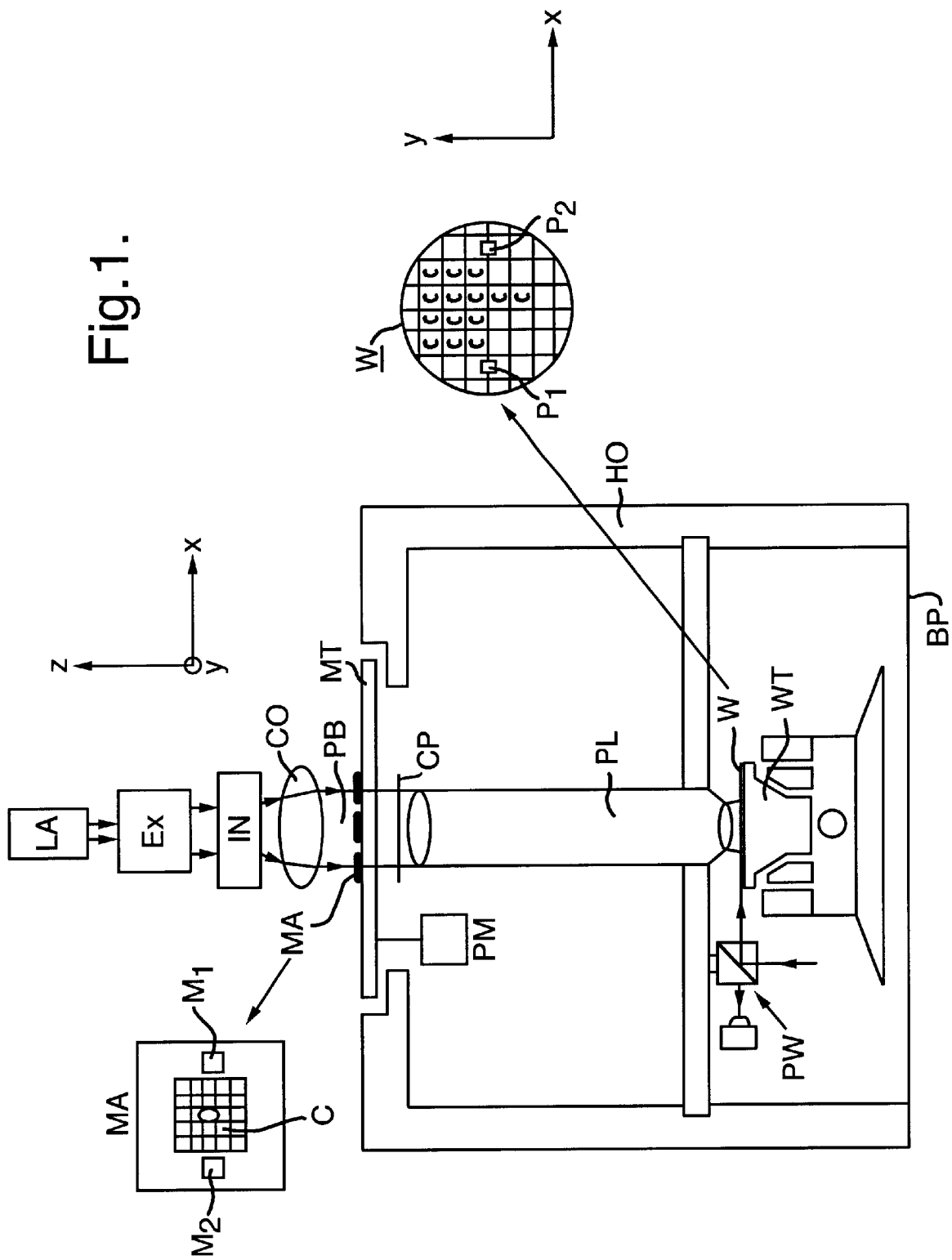
FIG. 1 renders an elevational view of a lithographic projection apparatus in which the current invention is applied.

FIG. 1 schematically depicts a lithographic projection apparatus according to the invention. The apparatus comprises:

- a radiation system LA, Ex, IN, CO for supplying a projection beam PB of radiation (e.g. UV radiation with a wavelength of 365 nm, 248 nm or 193 nm);
- a movable mask table MT provided with a mask holder for holding a mask (reticle) MA, and connected to positioning means PM for accurately positioning the mask with respect to item PL;
- a movable substrate table WT provided with a substrate holder for holding a substrate W (e.g. a resist-coated silicon wafer), and connected to positioning means PW for accurately positioning the substrate with respect to item PL;
- a projection system PL (e.g. a refractive or catadioptric system, or a mirror group) for imaging an irradiated portion of the mask MA onto a target portion C (die) of the substrate W. For simplicity, item PL may be referred to as the "lens".

The radiation system comprises a source LA (e.g. a Hg lamp or excimer laser) which produces a beam of radiation. This beam is passed along various optical components, —e.g. beam shaping optics Ex, an integrator IN and a condensor CO—so that the resultant beam PB has a desired shape and intensity profile in its cross-section.

The beam PB subsequently intercepts the mask MA which is held in a mask holder on the mask table MT. Having passed through the mask MA, the beam PB passes through the lens PL, which focuses the beam PB onto a target area C of the substrate W. With the aid of the interferometric displacement and measuring mechanism PW, the substrate table WT can be moved accurately, e.g. so as to position different target areas C in the path of the beam PB. Similarly, the positioning mechanism PM can be used to accurately position the mask MA with respect to the path of the beam PB, e.g. after mechanical retrieval of the mask MA from a mask library. In general, movement of the tables MT, WT will be realized with the aid of a long stroke module (course positioning) and a short stroke module (fine positioning), which are not explicitly depicted in FIG. 1.

The depicted apparatus can be used in two different modes:

In step mode, the mask table MT is kept essentially stationary, and an entire mask image is projected in one go (i.e. a single "flash") onto a target area C. The substrate table WT is then shifted in the x and/or y directions so that a different target area C can be irradiated by the beam PB;

In scan mode, essentially the same scenario applies, except that a given target area C is not exposed in a single "flash". Instead, the mask table MT is movable in a given direction (the so-called "scan direction", e.g. the x direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target area C can be exposed, without having to compromise on resolution.

In general, each target portion C of the substrate W will be subjected to various exposures, in successive irradiation sessions. These exposures will typically result in patterned layers (e.g. the circuit patterns in the various semiconductor layers of an IC) which will have to be accurately overlapped with one another (with a so-called "overlay precision" which is often of the order of nanometers). In general, optical distortion in the projection system will have a detrimental effect on the achievement of a desired overlay performance, and such distortion is thus highly undesirable. However, a perfectly distortion-free projection system is practically unachievable: even directly after manufacture, there will always be a certain amount of distortion, and this amount will typically increase as the projection system ages.

The invention offers a solution to this problem by placing an optical correction plate CP at some point outside the projection system PL and along its optical axis (in this case, between the mask table MT and the projection system PL). This plate CP has an aspherical surface profile whose form is calculated so as to counteract the measured distortion of the projection system PL. The form and effect of this plate CP are discussed further in Embodiment 2 below.

Embodiment 2

Figure 2:
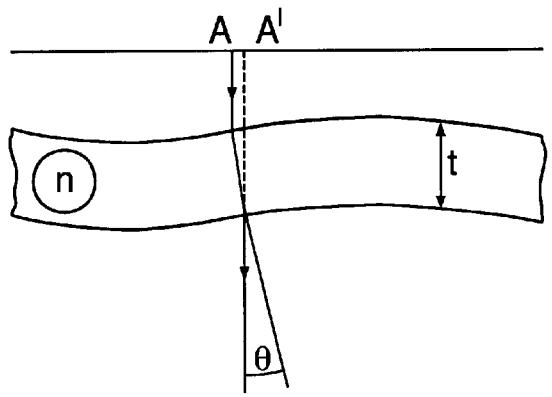
FIG. 2 gives a cross-sectional depiction of part of an optical correction plate as employed in the current invention.

FIG. 2 shows a cross-sectional view of part of an optical correction plate CP according to the present invention. The plate CP has a thickness t that is substantially constant throughout the extent of the plate. As depicted here, the aspherical form of the plate CP is heavily exaggerated, for the sake of emphasis.

The Figure shows the effect of the plate CP on the image of a point A located on a mask (not depicted) above the plate. The apparent position of the point A is shifted towards A' by refraction through the plate CP; in this manner, the plate produces a localized distortion. By appropriate choice/calculation of the aspherical profile of the plate CP, the resultant of such localized distortions over the extent of the plate can be given such a magnitude and sign as to substantially cancel the measured distortion of a projection system (not depicted) located beneath the plate.

Embodiment 3

Figure 3:
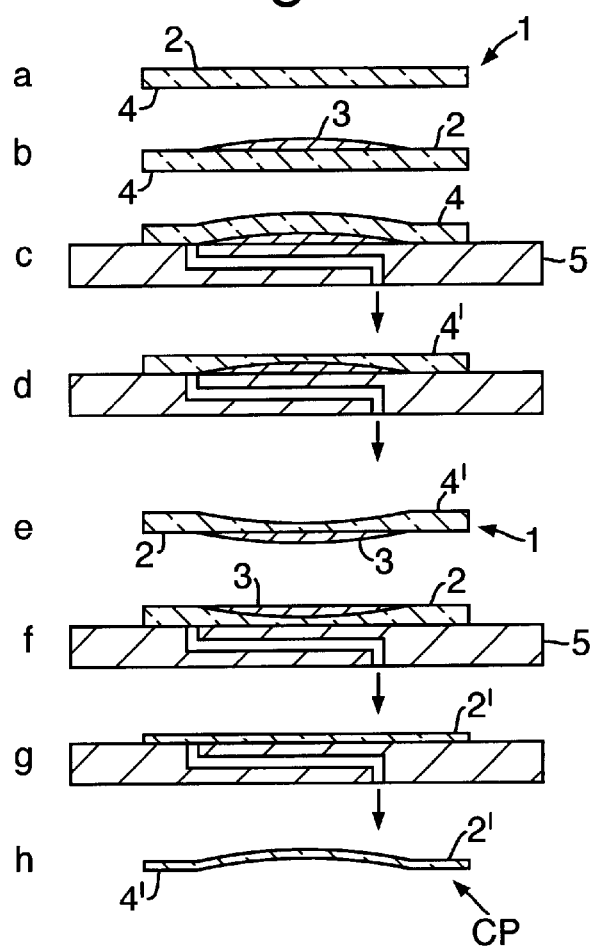
FIG. 3 depicts various steps in a process that can be used in the manufacture of an optical correction plate according to the invention.
Figure 2:
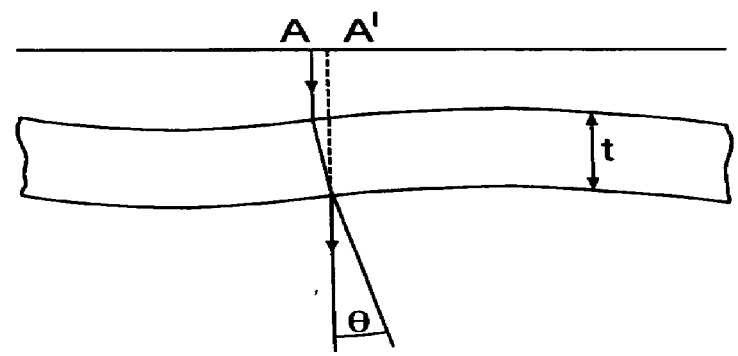
Figure 3:
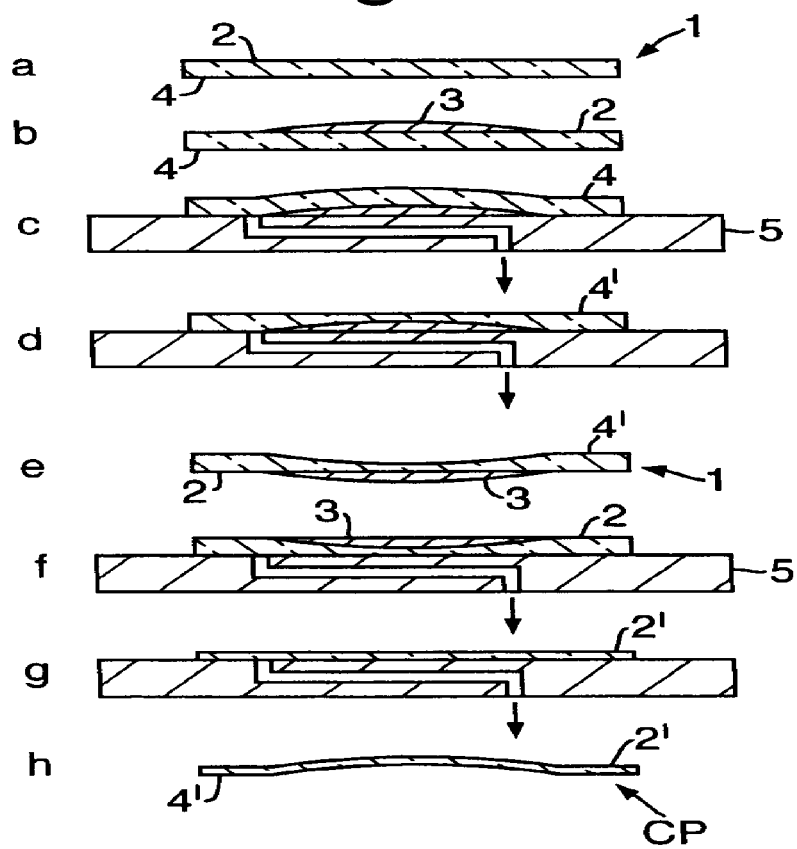

FIG. 3 depicts various steps in a manufacturing process that can be used to produce a correction plate CP as shown in FIG. 2.

A substantially flat plate 1 (step a), which is made of appropriate refractive material (e.g. quartz, or a glass with sufficient UV transmission), receives the calculated profile (typical height of several microns) on one side 2, by means of the deposition of a sequence of thin layers 3 (step b). In step c, the inverted plate 2 is sucked to a vacuum table 5, and the exposed surface 4 is polished flat (step d), thereby producing a new surface 4'; the plate 2 now has a substantially constant thickness. After releasing the plate 1, it is inverted (step e), sucked once more to the vacuum table 5 (step f) and worked flat once again, thereby taking away the initially deposited aspherical profile 3 (step g) and producing a new surface 2'. When the plate 1 is finally released, it has a substantially constant thickness, and assumes the desired aspherical shape on both sides. The result is a correction plate CP.

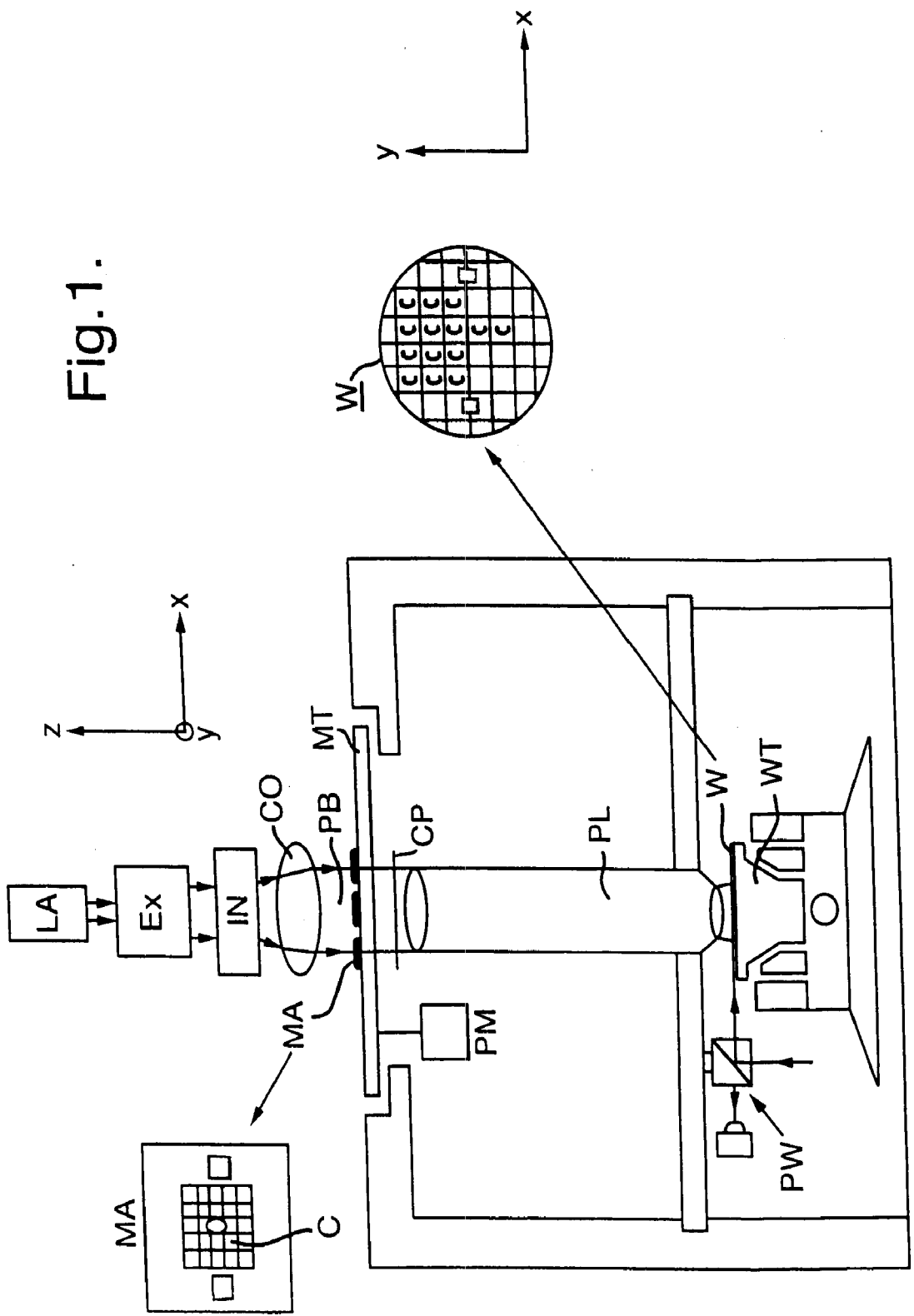

What is claimed is:

1. A lithographic projection apparatus comprising:

a radiation system for supplying a projection beam of radiation;

a mask table provided with a mask holder for holding a mask;

a substrate table provided with a substrate holder for holding a substrate;

a projection system for imaging an irradiated portion of the mask onto a target portion of the substrate; and a correction plate located outside of the projection system comprising a material which is substantially transparent to the radiation supplied by the radiation system, the plate having a substantially uniform thickness and an aspherical surface profile, which surface profile has a counteractive effect on a measured optical lateral-shift image error of the projection system.

2. Apparatus according to claim 1, the correction plate being located between the mask table and the projection system.

3. Apparatus according to claim 1 wherein the correction plate comprises a material selected from the group formed by glass, silica, quartz, and calcium fluoride.

4. Apparatus according to claim 1, wherein the correction plate has a thickness in the range 1–6 mm.

5. A method of reducing a measured optical lateral-shift image error in the projection system of a lithographic projection apparatus, which method comprises:

supplying a projection beam of radiation;

imaging an irradiated portion of a mask onto a target portion of a substrate with a projection system, correcting optical distortion with a correction plate at some point outside the projection system but along its optical axis, the correction plate comprising a material which is substantially transparent to the radiation supplied by the radiation system, the plate having a substantially uniform thickness and an aspherical surface profile, which surface profile has a counteractive effect on the measured optical lateral-shift image error.

6. A device manufacturing method comprising:

providing a substrate which is at least partially covered by a layer of radiation-sensitive material;

providing a mask which contains a pattern;

using a projection beam of radiation to project an image of at least a part of the mask pattern onto a target area of the layer of radiation-sensitive material using a projection system; and directing the projection beam through a correction plate comprising of material which is substantially transparent to the radiation, the plate having a substantially uniform thickness and an aspherical surface profile, which surface profile has a counteractive effect on a measured optical lateral-shift image error of the projecting system.

7. A device manufactured using the method claimed in claim 6.

8. Apparatus according to claim 2, wherein the correction plate comprises a material selected from the group formed by glass, silica, quartz, and calcium fluoride.

9. Apparatus according to claim 2, wherein the correction plate has a thickness in the range 1–6 mm.

10. Apparatus according to claim 3, wherein the correction plate has a thickness in the range 1–6 mm.

11. Apparatus according to claim 8, wherein the correction plate has a thickness in the range 1–6 mm.

* * * * *

UNITED STATES PATENT AND TRADEMARK OFFICE
CERTIFICATE OF CORRECTION

PATENT NO. : 6,373,552 B1
DATED : April 16, 2002
INVENTOR(S) : Braat et al.

It is certified that error appears in the above-identified patent and that said Letters Patent is hereby corrected as shown below:

Delete Title page and substitute attached Title page.

Delete drawing sheets 1 and 2 and substitute attached drawing sheets 1 and 2.

Signed and Sealed this

Sixteenth Day of May, 2006

JON W. DUDAS
*Director of the United States Patent and Trademark Office*

United States Patent
Braat et al.

(10) Patent No.: US 6,373,552 B1
(45) Date of Patent: *Apr. 16, 2002

(54) OPTICAL CORRECTION PLATE, AND ITS APPLICATION IN A LITHOGRAPHIC PROJECTION APPARATUS

(75) Inventors: Josephus J. M. Braat, Delft; Cornelis J. van der Laan, Maasluis, both of (NL)

(73) Assignee: ASM Lithography B.V., Veldhoven (NL)

(*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/484,200
(22) Filed: Jan. 18, 2000
(30) Foreign Application Priority Data
Jan. 20, 1999 (EP) .................................. 99200156
(51) Int. Cl.$^7$ ..................... G03B 27/68; G03B 27/00; G03B 27/32; G03B 21/00; G01B 11/02
(52) U.S. Cl. ................ 355/52; 355/18; 355/31; 355/47; 355/104; 355/50; 353/5; 353/69; 356/355
(58) Field of Search ................ 355/18, 31, 47, 355/104, 50, 52; 353/5, 69; 356/355

(56) References Cited

U.S. PATENT DOCUMENTS

| | | | |
|---|---|---|---|
| 3,255,005 A | * 6/1966 | Green | 96/36 |
| 3,573,456 A | * 4/1971 | Beeh | 250/65 |
| 5,392,119 A | 2/1995 | McArthur et al. | |
| 5,583,609 A | * 12/1996 | Mizutani et al. | 355/46 |
| 5,640,233 A | * 6/1997 | McArthur et al. | 356/124 |
| 5,871,266 A | * 2/1999 | Negishi et al. | 353/98 |
| 5,929,991 A | * 7/1999 | McArthur et al. | 356/355 |
| 5,994,006 A | * 11/1999 | Nishi | 430/22 |
| 6,034,378 A | * 3/2000 | Shiraishi | 250/559.29 |

FOREIGN PATENT DOCUMENTS

| | | |
|---|---|---|
| EP | 0 687 896 B1 | 12/1995 |
| EP | 0 724 199 A1 | 7/1996 |
| NL | 6612149 | 8/1966 |
| WO | 99/05709 | 2/1999 |

OTHER PUBLICATIONS

Japanese Patent Abstracts, re JP 58–95702, Jun. 1983.
Japanese Patent Abstracts, re JP 62–35619, Feb. 1987.
Japanese Patent Abstracts, re JP 63–158517, Jul. 1988.
Japanese Patnet Abstracts, re JP 63–232320, Sep. 1988.

* cited by examiner

Primary Examiner—Russell Adams
Assistant Examiner—Khaled Brown
(74) Attorney, Agent, or Firm—Pillsbury Winthrop LLP

(57) ABSTRACT

A plate with substantially constant thickness is used to compensate for the residual distortion in the image projected by a high-quality projection lens for lithography. The two surfaces of the plate have an identical aspherical profile, whose shape has been calculated using the measured distortion map of the lithographic objective. The figuring process applied to the plate uses the principle of polishing in the presence of an elastic deformation, so as to achieve the desired aspherical shape on both sides.

11 Claims, 2 Drawing Sheets

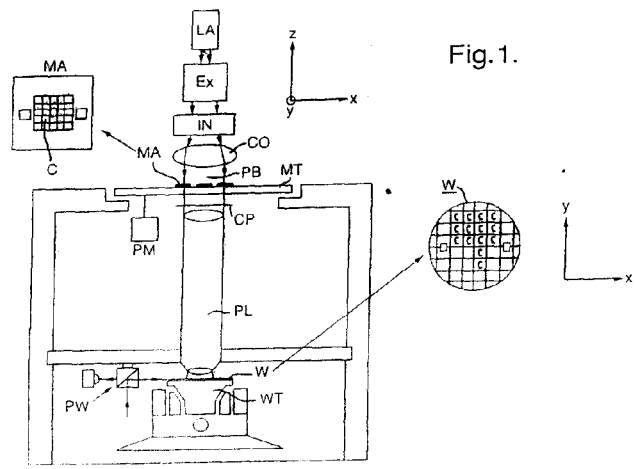

Fig. 1.